(12) United States Patent
Takashima

(10) Patent No.: US 10,236,060 B1
(45) Date of Patent: Mar. 19, 2019

(54) NONVOLATILE MEMORY DEVICE

(71) Applicant: KABUSHIKI KAISHA TOSHIBA, Minato-ku (JP)

(72) Inventor: Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/906,171

(22) Filed: Feb. 27, 2018

(30) Foreign Application Priority Data

Sep. 19, 2017 (JP) ................................ 2017-179267

(51) Int. Cl.
| | | |
|---|---|---|
| *G11C 11/00* | (2006.01) | |
| *G11C 13/00* | (2006.01) | |
| *H01L 45/00* | (2006.01) | |
| *H01L 27/24* | (2006.01) | |

(52) U.S. Cl.
CPC ...... *G11C 13/0069* (2013.01); *G11C 13/0004* (2013.01); *G11C 13/0038* (2013.01); *G11C 13/0097* (2013.01); *H01L 27/2436* (2013.01); *H01L 45/06* (2013.01); *H01L 45/1233* (2013.01); *H01L 45/144* (2013.01); *G11C 2013/009* (2013.01); *G11C 2213/71* (2013.01);
(Continued)

(58) Field of Classification Search
CPC ............ G11C 13/0069; G11C 13/0004; G11C 13/0038; G11C 13/0097
USPC .................................................. 365/148, 163
See application file for complete search history.

(56) References Cited

U.S. PATENT DOCUMENTS

| | | | |
|---|---|---|---|
| 2012/0176834 A1* | 7/2012 | Ikeda ................... | H01L 27/0688 365/148 |
| 2012/0236628 A1* | 9/2012 | Ikeda ................. | G11C 13/0007 365/148 |
| 2013/0141968 A1 | 6/2013 | Sasago et al. | |

(Continued)

FOREIGN PATENT DOCUMENTS

| | | |
|---|---|---|
| JP | 2010-102827 A | 5/2010 |
| JP | 2015-103271 | 6/2015 |
| WO | WO 2012/032730 A1 | 3/2012 |

OTHER PUBLICATIONS

S.H. Lee et al., "Programming Disturbance and Cell Scaling in Phase Change Memory: For up to 16nm based $4F^2$ Cell", 2010 Symposium on VLSI Technology (VLSIT) Digest of Technical Papers, Jun. 2010, pp. 2.

*Primary Examiner* — Vu Le
(74) *Attorney, Agent, or Firm* — Oblon, McClelland, Maier & Neustadt, L.L.P.

(57) ABSTRACT

According to one embodiment, a nonvolatile memory device includes word lines, bit lines, resistance change memory elements, each selectively exhibiting a low or high-resistance state, and a write voltage generating circuit generating a write voltage supplied to the resistance change memory element selected via the bit line selected. The write voltage generating circuit supplies the write voltage to the first and second resistance change memory elements connected to one selected word line and two selected bit lines adjacent to each other in a temporally overlapping manner, and generates the write voltage such that a magnitude of the write voltage supplied to the first resistance change memory element becomes smaller when a write voltage for high-resistance state setting is supplied to the second resistance change memory element than when a write voltage for low-resistance state setting is supplied.

8 Claims, 10 Drawing Sheets

(52) U.S. Cl.
CPC ...... *G11C 2213/79* (2013.01); *H01L 27/2481* (2013.01)

(56) References Cited

U.S. PATENT DOCUMENTS

| | | |
|---|---|---|
| 2014/0063929 A1 | 3/2014 | Willey |
| 2014/0204664 A1 | 7/2014 | Lee |
| 2014/0340956 A1* | 11/2014 | Murooka ........... G11C 13/0097 365/148 |
| 2015/0146474 A1 | 5/2015 | Murooka |

\* cited by examiner

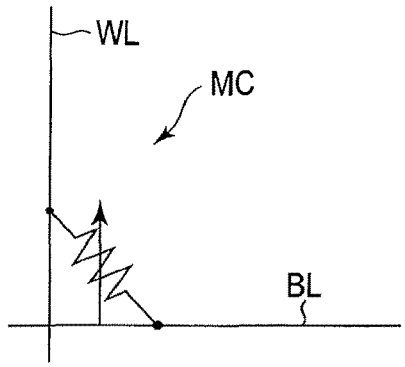
F I G. 1A
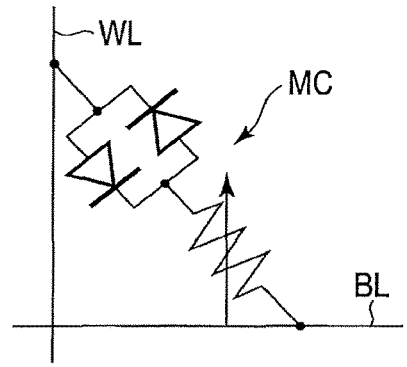
F I G. 1B
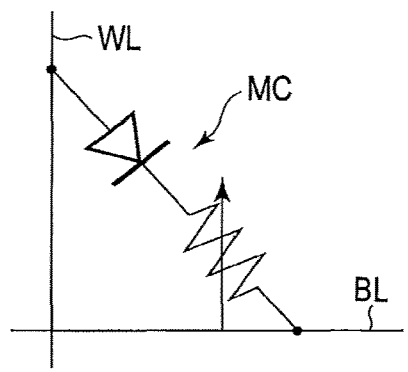
F I G. 1C
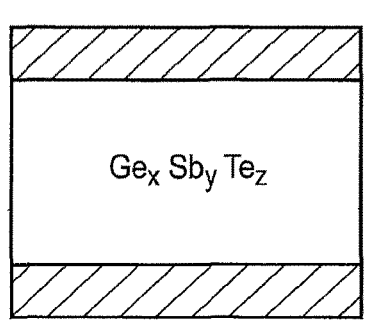
F I G. 2A
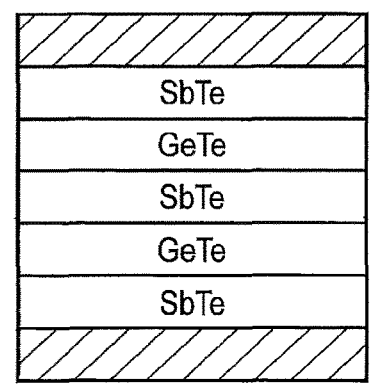
F I G. 2B

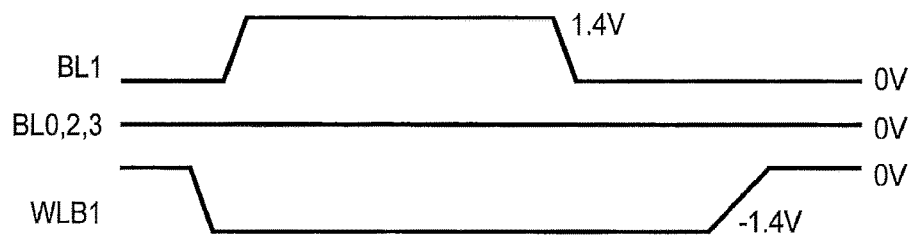
FIG. 7A
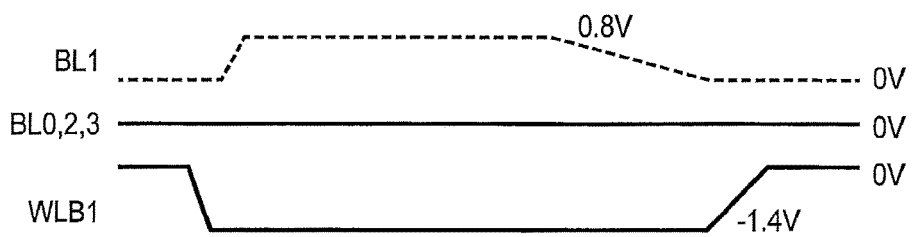
FIG. 7B
|            | Cell0 | Cell1 | Cell2 | Cell3 |
|------------|-------|-------|-------|-------|
| Reset [μA] | 0     | 100   | 0     | 0     |
| Set [μA]   | 0     | 50    | 0     | 0     |
FIG. 8
|                 | Cell0 | Cell1 | Cell2 | Cell3 |
|-----------------|-------|-------|-------|-------|
| Reset-Reset [μA]| 0     | 80    | 80    | 0     |
| Reset-Set [μA]  | 0     | 90    | 30    | 0     |
| Set-Set [μA]    | 0     | 40    | 40    | 0     |
FIG. 9

|  | Cell0 | Cell1 | Cell2 | Cell3 |
|---|---|---|---|---|
| Reset-Reset [μA] | 0 | 80 | 80 | 0 |
| Reset-Set [μA] | 0 | 90 | 30 | 0 |
| Set-Set [μA] | 0 | 40 | 40 | 0 |
FIG. 19
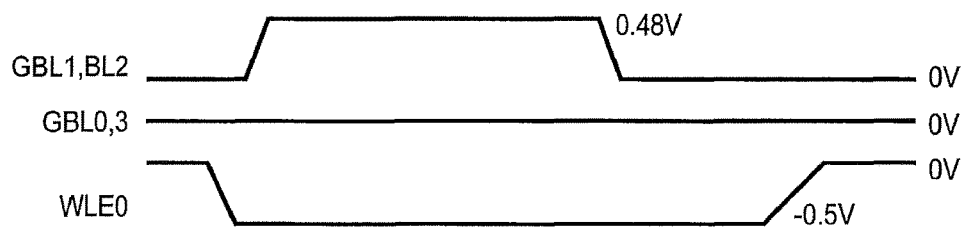
FIG. 20A
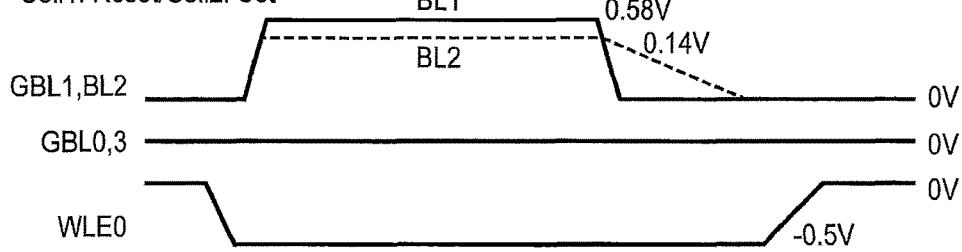
FIG. 20B
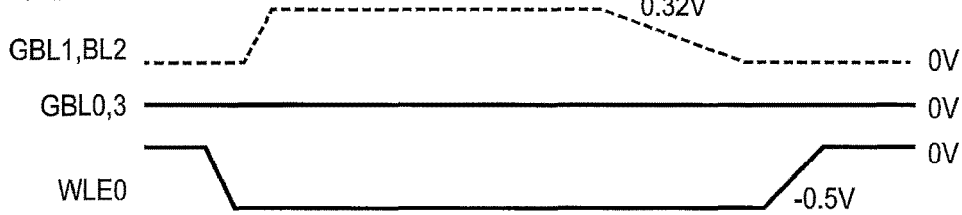
FIG. 20C

NONVOLATILE MEMORY DEVICE

CROSS-REFERENCE TO RELATED APPLICATIONS

This application is based upon and claims the benefit of priority from Japanese Patent Application No. 2017-179267, filed Sep. 19, 2017, the entire contents of which are incorporated herein by reference.

FIELD

Embodiments described herein relate generally to a nonvolatile memory device.

BACKGROUND

In recent years, research and development of resistance change memories such as PCM and ReRAM is actively conducted. Such resistance change memories have a large ratio of the resistance in a high-resistance state to that in a low-resistance state of about two to five orders of magnitude and are promising as a nonvolatile memory device.

However, conventional resistance change memories have a problem of large write currents. Thus, an IR drop caused by resistance of word lines and bit lines increases so that the number of memory cells that can be connected to one word line and one bit line is limited. Therefore, there arises a problem that the number of cells contained in a memory cell array cannot be increased.

As a factor of the above problem, a selected memory element cannot be efficiently heated because heat is dissipated from the selected memory element into its surroundings.

Therefore, a nonvolatile memory device capable of efficiently heating the selected memory element is desired.

BRIEF DESCRIPTION OF THE DRAWINGS

FIGS. 1A to 1C are equivalent circuit diagrams of nonvolatile memory devices using a resistance change memory element;

FIGS. 2A and 2B are diagrams schematically showing the configuration of resistance change memory elements;

FIGS. 7A and 7B are diagrams showing operations of Comparative Example;

FIG. 8 is a diagram showing an example of write currents in Comparative Example;

FIG. 9 is a diagram showing an example of write currents in the first embodiment;

FIG. 19 is a diagram showing an example of write currents in the fourth embodiment; and FIGS. 20A to 20C are diagrams showing concrete operations of the nonvolatile memory device according to the fourth embodiment.

DETAILED DESCRIPTION

In general, according to one embodiment, a nonvolatile memory device includes: a plurality of word lines; a plurality of bit lines intersecting the word lines; a plurality of resistance change memory elements, each of which being connected to a corresponding word line and a corresponding bit line and each of which selectively exhibiting a first resistance state or a second resistance state having higher resistance than the first resistance state; and a write voltage generating circuit that generates a write voltage to be supplied to the resistance change memory element selected via the bit line selected, wherein the resistance change memory elements include a first resistance change memory element and a second resistance change memory element adjacent to the first resistance change memory element in a extending direction of the word line, and the write voltage generating circuit supplies the write voltage to the first and second resistance change memory elements connected to one selected word line and two selected bit lines adjacent to each other in a temporally overlapping manner, and generates the write voltage such that a magnitude of the write voltage supplied to the first resistance change memory element becomes smaller when a write voltage for second resistance state setting is supplied to the second resistance change memory element than when a write voltage for first resistance state setting is supplied to the second resistance change memory element.

First, an overview of a nonvolatile memory device using a resistance change memory element will be provided.

Figure 3A:
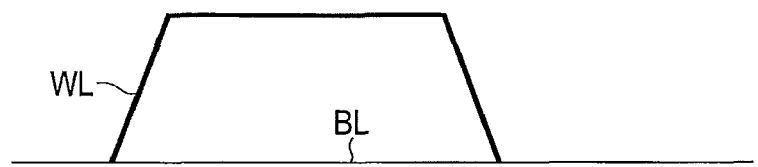
FIGS. 3A and 3B are diagrams showing write operations on the resistance change memory element.
Figure 3B:
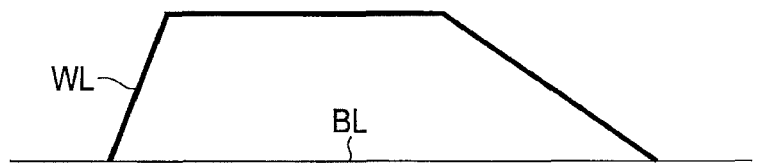

FIGS. 1A to 1C are equivalent circuit diagrams of nonvolatile memory devices using a resistance change memory element. FIGS. 2A and 2B are diagrams schematically showing the configuration of resistance change memory elements. FIGS. 3A and 3B are diagrams showing write operations on the resistance change memory element.

A memory cell unit MC is provided at an intersection of a word line WL and a bit line BL. A resistance state of a resistance change memory element is controlled by supplying a write voltage (write current) to the memory cell unit MC. More specifically, binary data can be stored by binary conditions of a high-resistance state (reset state) and a low-resistance state (set state). To prevent cells other than the selected cell from changing to a semi-selected state, a configuration (see FIG. 1A) giving a self-rectifying function to a resistance change memory element or a configuration (see FIGS. 1B and 1C) in which a rectifier or a bidirectional rectifier is connected to a resistance change memory element is normally adopted.

When a phase change memory (PCM) is used as a resistance change memory element, a configuration using a chalcogenide material (for example, GeSbTe) as shown in FIG. 2A or a configuration using a superlattice material (SbTe/GeTe/SbTe/GeTe/SbTe) as shown in FIG. 2B can be cited.

A write operation to a high-resistance state (reset state) is performed by, as shown in FIG. 3A, an operation (rapid cooling operation) that rapidly lowers a voltage after the voltage higher than that during set operation being applied. A write operation to a low-resistance state (set state) is performed by, as shown in FIG. 3B, an operation (slow cooling operation) that slowly lowers a voltage after the voltage lower than that during reset operation being applied.

Next, an overview of an embodiment will be provided.

In a memory cell array in which resistance change memory elements are connected to intersections of a plurality of word lines and a plurality of bit lines, one word line and two bit lines adjacent to each other are selected and an operation to make the resistance lower (set operation) or an operation to make the resistance higher (reset operation) almost simultaneously on two resistance change memory elements adjacent to each other. At this point, the two resistance change memory elements on which a write operation is performed almost simultaneously are adjacent to each other and thus, thermal energy generated by currents is diffused between the resistance change memory elements adjacent to each other. Therefore, energy consumption during writing can be reduced by thermal energy from one resistance change memory element being used by the other resistance change memory element and thermal energy from the other resistance change memory element being used by one resistance change memory element.

By making mutual use of thermal energy as described above, both of a set current and a reset current can be reduced so that currents flowing to the word lines and the bit lines can be reduced. As a result, the IR drop can be reduced and the number of memory elements in the array can be increased and therefore, the cost can be reduced.

Incidentally, memories that write to adjacent memory cells simultaneously include DRAM and NAND flash memories. In the present embodiment, however, simultaneous writing into adjacent memory cells is not simply performed. The reason therefor is that a thermal disturbance to cells adjacent to each other becomes a serious problem in resistance change memory elements.

In the present embodiment, a write operation is performed as described below when a set operation (write operation to a low-resistance state) is performed on a desired resistance change memory element. When a set operation is performed on a resistance change memory element adjacent to a desired resistance change memory element, thermal energy is supplied from the adjacent resistance change memory element to the desired resistance change memory element. By using the thermal energy, the write current can be reduced than when writing is performed alone into the desired resistance change memory element. When a reset operation is performed on a resistance change memory element adjacent to a desired resistance change memory element, the write current can further be reduced because more thermal energy is supplied from the adjacent resistance change memory element.

A write operation can also be performed according to a similar principle when a reset operation (write operation to a high-resistance state) is performed on a desired resistance change memory element. When a reset operation is performed on a resistance change memory element adjacent to a desired resistance change memory element, the write current can be reduced than when writing is performed alone to the desired resistance change memory element because thermal energy is supplied from the adjacent resistance change memory element to the desired resistance change memory element. When a reset operation is performed on a resistance change memory element adjacent to a desired resistance change memory element, the write current can further be reduced because more thermal energy is supplied from the adjacent resistance change memory element.

In the present embodiment, therefore, the write current (the set current and the reset current) to two resistance change memory elements adjacent to each other can be reduced and so power consumption per bit can be reduced. As a result, higher integration can be achieved and also the cost can be reduced.

Also in the present embodiment, the total quantity of heat supplied to two resistance change memory elements adjacent to each other is controlled thus, a thermal disturbance by excessive heat can be suppressed. Further, both currents of two resistance change memory elements adjacent to each other can be reduced and thus, a thermal disturbance to resistance change memory elements provided around the two resistance change memory elements adjacent to each other can be suppressed.

Incidentally, the write method in the present embodiment can also be applied to three-dimensional memories in which the bit line is provided in a direction perpendicular to the substrate (semiconductor wafer).

Also, only cells adjacent to each other to which simultaneous writing is performed may be directly connected by a chalcogenide material. By adopting such a structure, thermal resistance between adjacent cells directly connected by the chalcogenide material can be lowered and also thermal resistance to surrounding cells can be increased. As a result, heat can be mutually used efficiently only between two selected cells adjacent to each other.

When writing to the local memory element, write data to the adjacent memory elements is already determined. Thus, the operation in the present embodiment can be performed only by providing a circuit that switches a write voltage (write current) to the local memory element in accordance with write data to adjacent memory elements.

Also, the write method in the present embodiment is particularly suitable to phase change memories that are set and reset by heat (phase change memories using materials containing germanium (Ge), antimony (Sb), and tellurium (Te)). Also, the write method in the present embodiment is applicable to phase change memories using a superlattice of Ge, Sb, and Te. Further, the method in the present embodiment is also applicable to a configuration in which a memory element and a rectifying element (an MIM (metal/insulator/metal) rectifying element, a rectifying element using SiTe or GeTe and the like) are connected in series.

Hereinafter, concrete embodiments will be described with reference to the drawings.

First Embodiment

Figure 4:
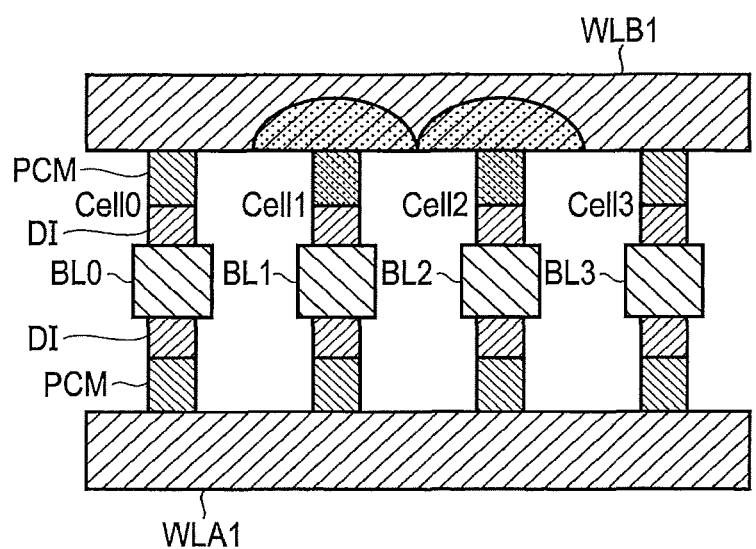
FIG. 4 is a sectional view along a word line direction schematically showing the configuration of a nonvolatile memory device according to a first embodiment.
Figure 5:
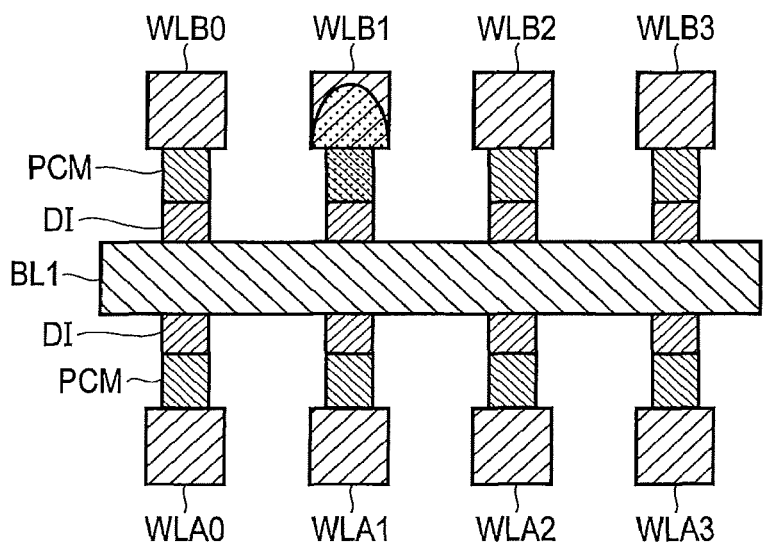
FIG. 5 is a sectional view along a bit line direction schematically showing the configuration of the nonvolatile memory device according to the first embodiment.
Figure 6:
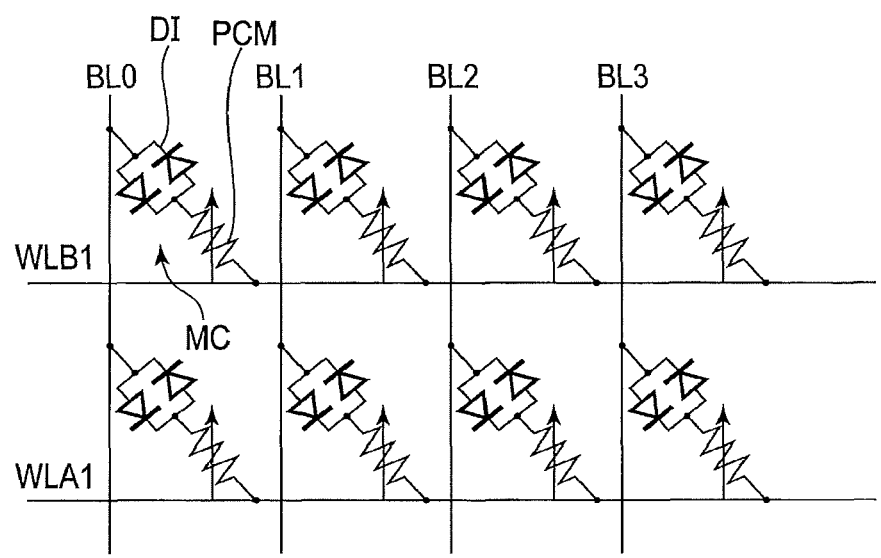
FIG. 6 is an equivalent circuit diagram showing the configuration of the nonvolatile memory device according to the first embodiment.

FIGS. 4 and 5 are sectional views schematically showing the configuration of a nonvolatile memory device according to the present embodiment. FIG. 4 is a sectional view along the word line direction and FIG. 5 is a sectional view along the bit line direction. FIG. 6 is an equivalent circuit diagram showing the configuration of the nonvolatile memory device according to the present embodiment.

As is shown in FIGS. 4 to 6, a memory cell unit MC formed by series connection of a resistance change memory element PCM and a diode DI is provided at intersections of a plurality of word lines and a plurality of bit lines. In the present example, a plurality of memory cell units MC is arranged three-dimensionally.

The resistance change memory element PCM in the first layer is connected to the intersection of a word line WLA and a bit line BL and the resistance change memory element PCM in the second layer is connected to the intersection of the bit line BL and a word line WLB. In the present example, the memory cell unit MC is constructed by the rectifying element (diode DI) being connected to the resistance change memory element PCM in series. In the equivalent circuit in FIG. 6, two layers of the memory cell unit MC are shown two-dimensionally.

A chalcogenide material can be used for the resistance change memory element PCM. For example, GeSbTe for phase change memory can be used. GeSbSe, GeTe, or SbTe may also be used. Also, a superlattice material in which GeTe and SbTe are alternately stacked may be used. As the rectifying element, MIM (metal/insulator/metal) may be used or a chalcogenide material of SiTe, GeTe, or GeSe may be used.

Next, the operation of a nonvolatile memory device will be described.

First, a conventional operation will be described as Comparative Example.

FIGS. 7A and 7B are diagrams showing operations of Comparative Example. For a reset operation (FIG. 7A), among a plurality of word lines and a plurality of bit lines, one word line WLB1 is set to −1.4 V and one bit line BL1 is set to 1.4 V. Accordingly, the voltage of 2.8 V is applied to a selected Cell1 only and the voltage of 1.4 V or less is applied to other cells. For a set operation (FIG. 7B), one word line WLB1 is set to −1.4 V and one bit line BL1 is set to 0.8 V. Accordingly, the voltage of 2.2 V is applied to the selected Cell1 only.

FIG. 8 is a diagram showing an example of write currents in Comparative Example described above. For a reset operation (operation to make the resistance higher), the current is rapidly reduced after the current of 100 µA being passed. For a set operation (operation to make the resistance lower), the current is slowly reduced after the current of 50 µA being passed.

In Comparative Example, as described above, writing is performed to only the cell at the intersection of the selected word line and the selected bit line. In this case, heat generated in the selected cell diffuses to its surroundings and thus, good thermal efficiency is not obtained, posing a problem that a large reset current and a large set current are needed. Thus, the IR drop of wire (word lines, bit lines) increases, posing a problem that the array size cannot be increased.

In the present embodiment, thermal diffusion to the aforementioned adjacent cells (thermal diffusion from the adjacent cells) is used and also optimum heat generation is controlled. Hereinafter, a description thereof is provided.

In the present embodiment, as shown in FIGS. 4 and 5, one word line (for example, WLB1) and two bit lines adjacent to each other (for example, BL1 and BL2) are selected and writing is performed to the two bit lines adjacent to each other almost simultaneously (such that periods in which a current is passed overlap). In this case, the two cells to which writing is performed are adjacent to each other and thus, heat in the two cells diffuse to each other. That is, in addition to heat generated in the local cell, heat generated in adjacent cells is also supplied to the local cell. As a result, compared with the past, power consumption per bit can be reduced. In FIGS. 4 and 5, regions where heat is diffused are indicated by dots.

In the method according to the present embodiment, as described above, the write current (the set current and the reset current) can be reduced and thus, the current passed to the word lines and the bit lines can be reduced. Therefore, the IR drop can be suppressed and the array size can be increased. As a result, the production cost can be lowered.

In the present embodiment, however, simultaneous writing (almost simultaneous writing) is not performed simply to two adjacent cells. Hereinafter, a description thereof is provided.

FIG. 9 is a diagram showing an example of write currents in the present embodiment.

When a reset operation (a write operation to a high-resistance state) is performed on the desired cell (Cell1) and a cell (Cell2) adjacent to the desired cell (Cell1) (Case 1), the write operation is performed as described below. Heat is diffused to each other between Cell1 and Cell2. Also, a large current is passed the selected cell in a reset operation. Thus, the current of 80 µA, which is less than 100 µA (the current for single writing shown in Comparative Example), is set to both of Cell1 and Cell2.

When a reset operation (a write operation to a high-resistance state) is performed on the desired cell (Cell1) and a set operation (a write operation to a low-resistance state) is performed on a cell (Cell2) adjacent to the desired cell (Cell1) (Case 2), the write operation is performed as described below. In this case, a medium current is passed to Cell2. Thus, the current of 90 µA is set to Cell1. Because a large current is passed to Cell1, the current of 30 µA, which is less than 50 µA (the current for single writing shown in Comparative Example), is set to Cell2.

When a set operation (a write operation to a low-resistance state) is performed on the desired cell (Cell1) and a cell (Cell2) adjacent to the desired cell (Cell1) (Case 3), the write operation is performed as described below. In this case, a medium current is passed to Cell1 and Cell2. Thus, the current of 40 µA, which is slightly less than 50 µA (the current for single writing shown in Comparative Example), is set to both of Cell1 and Cell2.

When a set operation is performed on the desired cell (Cell1) and a reset operation is performed on a cell (Cell2) adjacent to the desired cell (Cell1) (Case 4), an operation similar to that described in Case 2 (however, 30 µA is set to Cell1 and 90 µA is set to Cell2) may be performed.

By adopting the method according to the present embodiment described above, there is no need to supply a write current larger than necessary to the two selected cells (two cells adjacent to each other). Therefore, power consumption per bit can be reduced. As a result, higher integration can be achieved and also the cost can be reduced. In addition, the total quantity of heat supplied to the two selected cells (two cells adjacent to each other) can be suppressed and thus, a thermal disturbance caused by excessive heat can be suppressed. Further, the current itself to the two selected cells (Cell1, Cell2) can be reduced and thus, a thermal disturbance to cells (Cell0, Cell3) around these cells can also be suppressed.

FIG. 10 is a diagram showing concrete operations of the nonvolatile memory device according to the present embodiment. Here, as shown in Comparative Example, the reset voltage for single writing is set to 1.4 V and the set voltage is set to 0.8 V.

The operation when both of Cell1 and Cell2 are reset (Case 1) is as described below. In this case, the voltage of −1.4 V is applied to the word line WLB1 and the voltage of 1.1 V is applied to both of the bit lines BL1, BL2. As a result, the voltage of 2.5 V is applied to both of Cell1 and Cell2.

The operation when Cell1 is reset and Cell2 is set (Case 2) is as described below. In this case, the voltage of −1.4 V is applied to the word line WLB1, the voltage of 1.26 V is applied to the bit line BL1, and the voltage of 0.64 V is applied to the bit line BL2. As a result, the voltage of 2.66 V is applied to Cell1 and the voltage of 2.04 V is applied to Cell2.

The operation when both of Cell1 and Cell2 are set (Case 3) is as described below. In this case, the voltage of −1.4 V is applied to the word line WLB1 and the voltage of 0.72 V is applied to both of the bit lines BL1, BL2. As a result, the voltage of 2.12 V is applied to both of Cell1 and Cell2.

The operation when the Cell1 is set and the Cell2 is reset (Case 4) is similar to that in Case 2 (however, the voltage of 0.64 V is applied to the bit line BL1 and the voltage of 1.26 V is applied to the bit line BL2).

Figure 11:
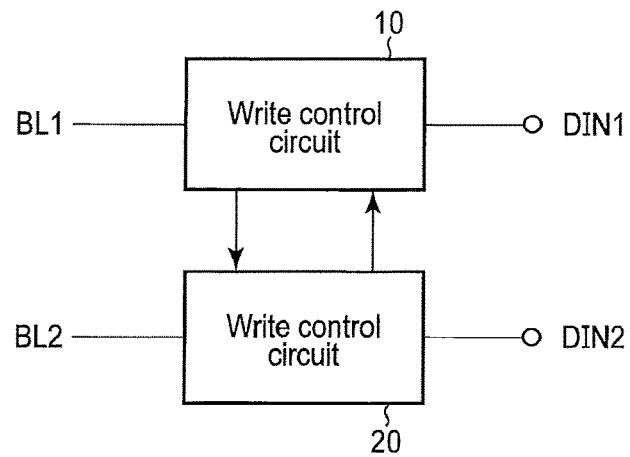
FIG. 11 is a block diagram showing an overall configuration of a write control circuit to implement an operation of the nonvolatile memory device according to the first embodiment.

FIG. 11 is a block diagram showing an overall configuration of a write control circuit to implement the above operation.

As is evident from the above description, the write method in the present embodiment handles 2-bit data (binary data) as a pair. In FIG. 11, data to be written into Cell1 is denoted as DIN1 and data to be written into Cell2 is denoted as DIN2. DIN1 and DIN2 are input into write control circuits 10, 20 respectively. The write control circuit 10 generates a write voltage based on local data DIN1 and other data DIN2 and supplies the write voltage to the bit line BL1. The write control circuit 20 generates a write voltage based on local data DIN2 and other data DIN1 and supplies the write voltage to the bit line BL2.

Figure 12:
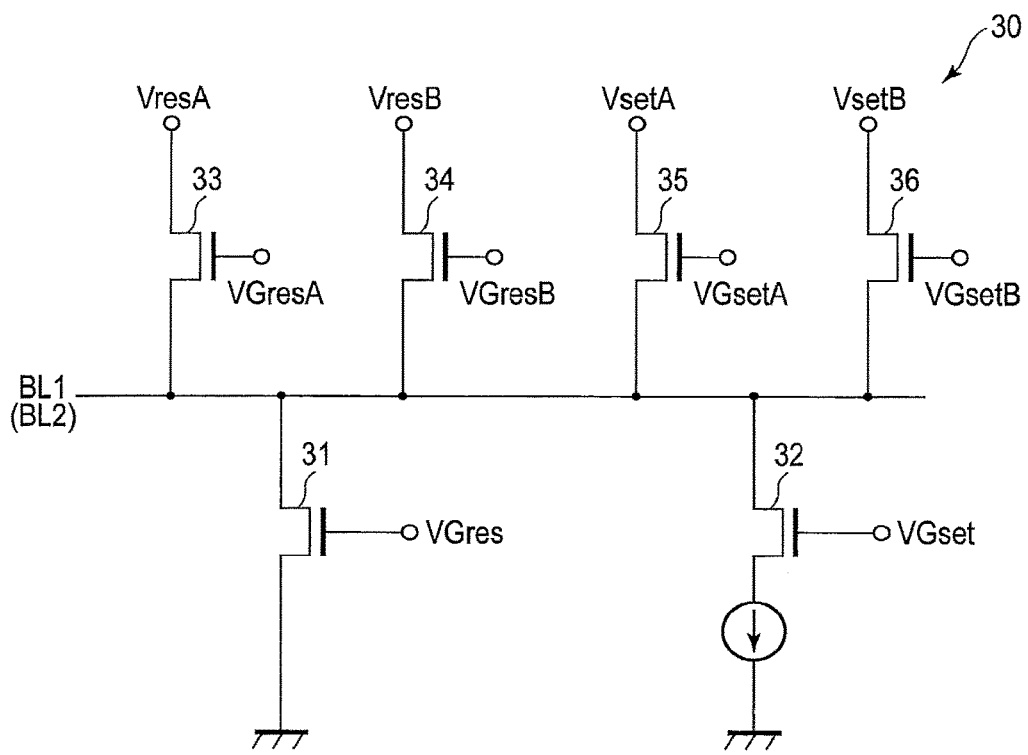
FIG. 12 is an electric circuit diagram showing a concrete configuration of a write voltage generating circuit of the write control circuit.

FIG. 12 is an electric circuit diagram showing a concrete configuration of a write voltage generating circuit 30 in the write control circuit 10 (or the write control circuit 20) shown in FIG. 11.

The write voltage generating circuit 30 in the write control circuit 10 generates a write control signal based on the local data DIN1 and the other data DIN2 to supply the write control signal to transistors 31 to 36.

A control signal VGres is applied to the gate of the transistor 31 and a control signal VGset is applied to the gate of the transistor 32. When Cell1 is reset, the transistor 31 is turned on and the transistor 32 is turned off. When Cell1 is set, the transistor 31 is turned off and the transistor 32 is turned on.

Control signals VGresA, VGresB, VGsetA, and VGsetB are applied to the gates of the transistors 33, 34, 35, 36 respectively. A voltage VresA (for example, 1.1 V), a voltage VresB (for example, 1.26 V), a voltage VsetA (for example, 0.72 V), and a voltage VsetB (for example, 0.64 V) are supplied to the drains of the transistors 33, 34, 35, 36 respectively.

Figure 10A:
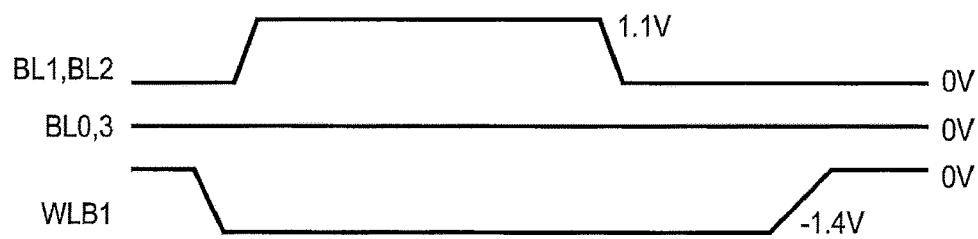
FIGS. 10A to 10C are diagrams showing concrete operations of the nonvolatile memory device according to the first embodiment.

The operation when both of Cell1 and Cell2 are reset (Case 1) is as described below. In this case, the control signal VGres of the transistor 31 is set to an ON state and the gate signal VGset of the transistor 32 is set to an OFF state. Also, the control signal VGresA of the transistor 33 is set to the ON state and the control signals VGresB, VGsetA, VGsetB of the transistors 34, 35, 36 are set to the OFF state. As a result, only the transistors 31, 33 are turned on and a signal as shown in FIG. 10A is supplied to the bit line BL1. In this case, a similar operation is performed for the bit line BL2 in the write voltage generating circuit 30 inside the write control circuit 20 of FIG. 11.

Figure 10B:
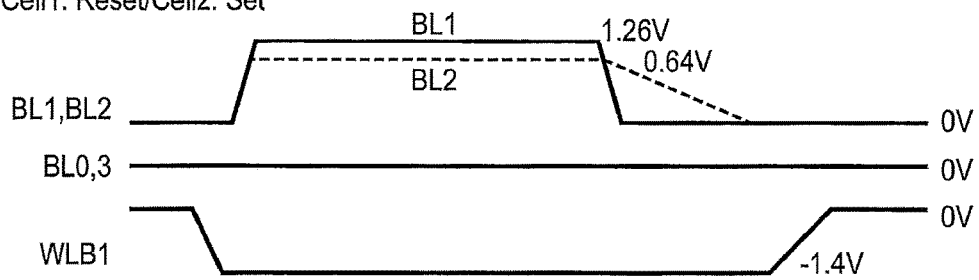

The operation when Cell1 is reset and Cell2 is set (Case 2) is as described below. In this case, the control signal VGres of the transistor 31 is set to an ON state and the gate signal VGset of the transistor 32 is set to an OFF state. Also, the control signal VGresB of the transistor 34 is set to the ON state and the control signals VGresA, VGsetA, VGsetB of the transistors 33, 35, 36 are set to the OFF state. As a result, only the transistors 31, 34 are turned on and a signal as shown in FIG. 10B is supplied to the bit line BL1. The control signal VGres of the transistor 31 is set to the OFF state and the gate signal VGset of the transistor 32 is set to the ON state for the bit line BL2 in the write voltage generating circuit 30 inside the write control circuit 20 of FIG. 11. Also, the control signal VGsetB of the transistor 36 is set to the ON state and the control signals VGresA, VGresB, VGsetA of the transistors 33, 34, 35 are set to the OFF state. As a result, only the transistors 32, 36 are turned on and a signal as shown in FIG. 10B is supplied to the bit line BL2.

Figure 10C:
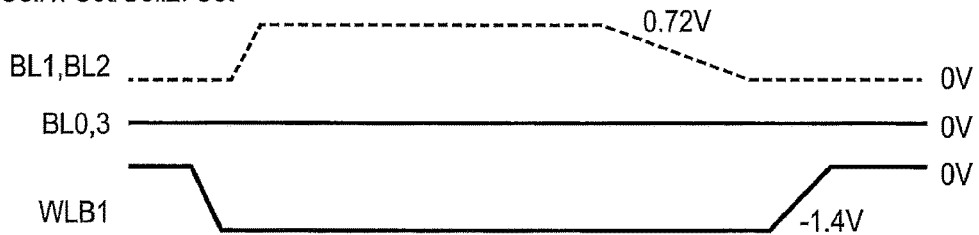

The operation when both of Cell1 and Cell2 are set (Case 3) is as described below. In this case, the control signal VGres of the transistor 31 is set to the OFF state and the gate signal VGset of the transistor 32 is set to the ON state. Also, the control signal VGsetA of the transistor 35 is set to the ON state and the control signals VGresA, VGresB, VGsetB of the transistors 33, 34, 36 are set to the OFF state. As a result, only the transistors 32, 35 are turned on and a signal as shown in FIG. 10C is supplied to the bit line BL1. In this case, a similar operation is also performed for the bit line BL2 in the write voltage generating circuit 30 inside the write control circuit 20 of FIG. 11.

The operation when Cell1 is set and Cell2 is reset (Case 4) is basically similar to the operation of Case 2 and can easily be inferred from the operation of Case 2 and so the description thereof is omitted.

Incidentally, in addition to the above write circuit, a read circuit is connected to the bit line and when reading, data stored in a memory cell is read into the read circuit via the bit line.

In the present embodiment, as described above, the write current (the set current and the reset current) to two resistance change memory elements adjacent to each other can be reduced and so power consumption per bit can be reduced. As a result, higher integration can be achieved and also the cost can be reduced. Also in the present embodiment, the total quantity of heat supplied to two resistance change memory elements adjacent to each other is controlled thus, a thermal disturbance by excessive heat can be suppressed. Further, both currents of two resistance change memory elements adjacent to each other can be reduced and thus, a thermal disturbance to resistance change memory elements provided around these two resistance change memory elements can be suppressed. In the present embodiment, therefore, memory elements can be heated efficiently and appropriately so that excellent nonvolatile memory devices can be obtained.

Second Embodiment

Next, a second embodiment will be described. Incidentally, basic matters are similar to those in the first embodiment and thus, the description of matters described in the first embodiment is omitted.

Figure 13:
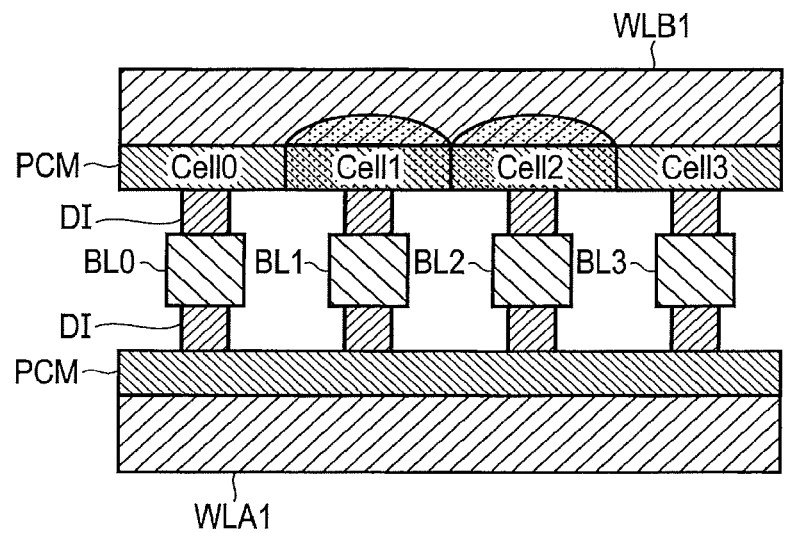
FIG. 13 is a sectional view along the word line direction schematically showing the configuration of a nonvolatile memory device according to a second embodiment.
Figure 14:
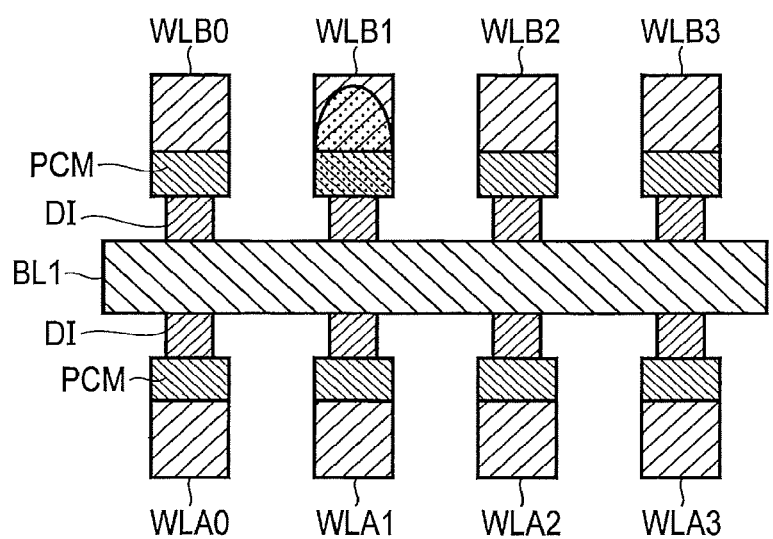
FIG. 14 is a sectional view along the bit line direction schematically showing the configuration of the nonvolatile memory device according to the second embodiment.

FIGS. 13 and 14 are sectional views schematically showing the configuration of a nonvolatile memory device according to the present embodiment. FIG. 13 is a sectional view along the word line direction and FIG. 14 is a sectional view along the bit line direction.

In the first embodiment, each resistance change memory element PCM has a pillar shape and the resistance change memory elements PCM adjacent to each other are separated from each other, In the present embodiment, the resistance change memory element PCM is continuously provided in a word line direction. That is, a resistance change memory element material (chalcogenide material) is continuously formed also in regions between the resistance change memory elements PCM adjacent to each other.

By adopting the structure in the present embodiment as described above, heat can efficiently be transmitted via the resistance change memory element material (chalcogenide material) between cells. Thus, the transmission efficiency of heat is enhanced and therefore, lower power consumption is promoted.

Third Embodiment

Next, a third embodiment will be described. Incidentally, basic matters are similar to those in the first embodiment and thus, the description of matters described in the first embodiment is omitted.

Figure 15:
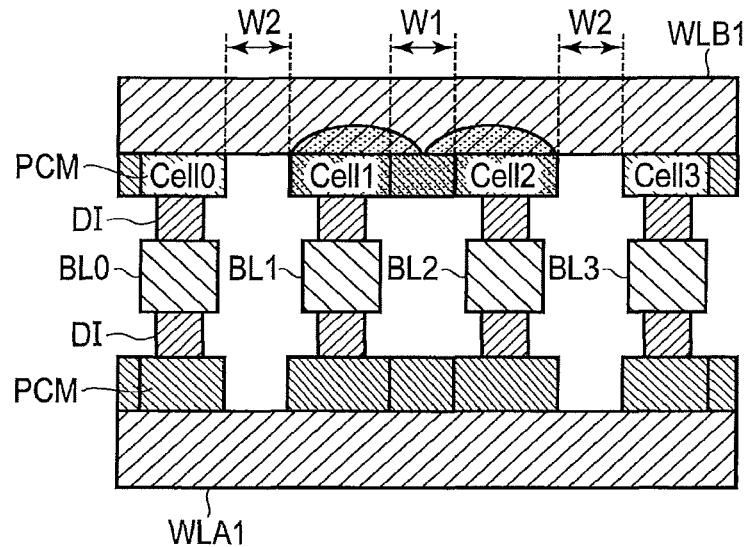
FIG. 15 is a sectional view along the word line direction schematically showing the configuration of a nonvolatile memory device according to a third embodiment.
Figure 16:
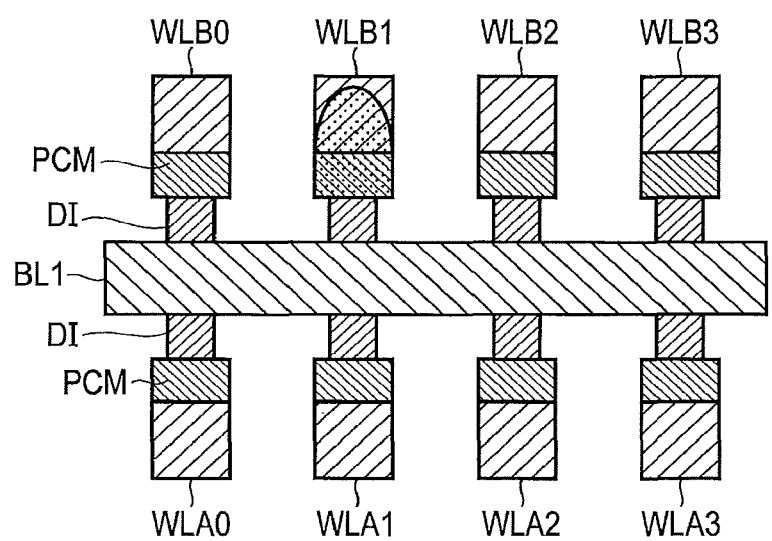
FIG. 16 is a sectional view along the bit line direction schematically showing the configuration of the nonvolatile memory device according to the third embodiment.

FIGS. 15 and 16 are sectional views schematically showing the configuration of a nonvolatile memory device according to the present embodiment. FIG. 15 is a sectional view along the word line direction and FIG. 16 is a sectional view along the bit line direction.

In the present embodiment, a resistance change memory element material is continuously provided only in regions between two adjacent cells (Cell1 and Cell2) that are activated simultaneously. No resistance change memory element material is provided between Cell1 and Cell0. Similarly, no resistance change memory element material is provided between Cell2 and Cell3.

By adopting the structure in the present embodiment as described above, heat can be transmitted more efficiently between two adjacent cells (Cell1 and Cell2) that are activated simultaneously. Also, transmission of heat to cells (Cell0 and Cell3) to which heat should not be transmitted can efficiently be suppressed. Therefore, lower power consumption is further promoted and also a thermal disturbance to adjacent cells (Cell0 and Cell3) can be suppressed.

In the present embodiment, as is evident from the above description, every other inter-element region between resistance change memory elements arranged in the word line direction is directly connected by a resistance change memory element material (chalcogenide material). The width in the word line direction of the inter-element region is preferably smaller in a region directly connected by the resistance change memory element material (chalcogenide material) than in a region not directly connected by the resistance change memory element material (chalcogenide material). That is, as shown in FIG. 15, if the width of a region directly connected by the resistance change memory element material is W1 and the width of a region not directly connected by the resistance change memory element material is W2, W1<W2 preferably holds. By adopting such a configuration, the above effect can be achieved more effectively.

Fourth Embodiment

Next, a fourth embodiment will be described. Incidentally, basic matters are similar to those in the first embodiment and thus, the description of matters described in the first embodiment is omitted.

Figure 17:
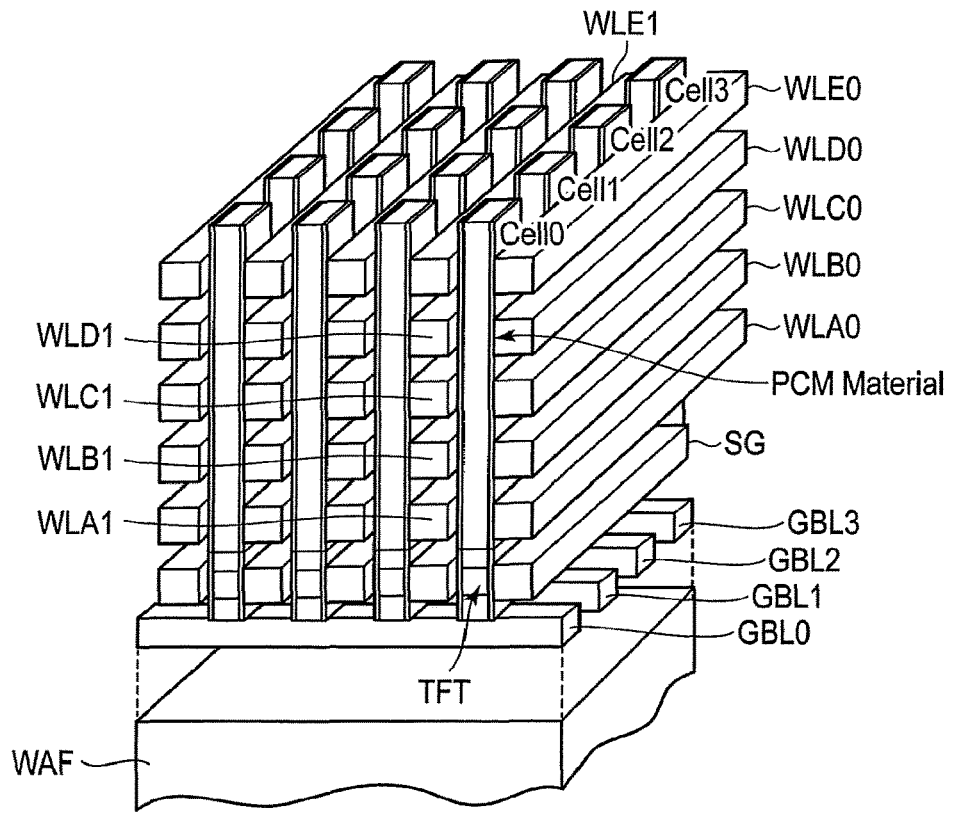
FIG. 17 is a bird's eye view schematically showing the configuration of a nonvolatile memory device according to a fourth embodiment.
Figure 18:
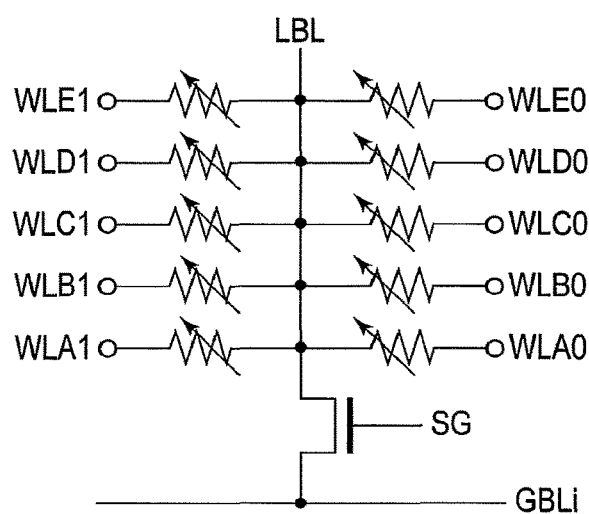
FIG. 18 is an equivalent circuit diagram showing the configuration of the nonvolatile memory device according to the fourth embodiment.

FIG. 17 is a bird's eye view schematically showing the configuration of a nonvolatile memory device according to the present embodiment. FIG. 18 is an equivalent circuit diagram showing the configuration of the nonvolatile memory device according to the present embodiment. FIG. 19 is a diagram showing an example of write currents in the present embodiment. FIG. 20 is a diagram showing concrete operations of the nonvolatile memory device according to the present embodiment.

In the present embodiment, a three-dimensional memory is constructed by extending the bit line (local bit line LBL) in a direction perpendicular to the principal surface of the substrate (semiconductor wafer WAF).

A PCM material is provided on both sides of the local bit line LEL. That is, the PCM material is sandwiched between the word line WL extending in the horizontal direction and the local bit line LBL extending in the vertical direction. The local bit line LBL is connected to a global bit line GBL via a select gate SG (thin film transistor TFT).

For example, when simultaneous writing into Cell1 and Cell2 is performed, a current is passed between a word line WLE0 and a global bit line GBL1 and between the word line WLE0 and a global bit line GBL2. FIG. 19 shows an example of write currents and is basically similar to those in the first embodiment (see FIG. 9). The concrete write operations shown in FIG. 20 are basically similar to those in the first embodiment (see FIG. 10) (however, voltage values are different from those of FIG. 10).

Also when a three-dimensional memory is constructed like in the present embodiment, an effect similar to that described in the first embodiment can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A nonvolatile memory device comprising:
   a plurality of word lines;
   a plurality of bit lines intersecting the word lines;
   a plurality of resistance change memory elements, each of which being connected to a corresponding word line and a corresponding bit line and each of which selectively exhibiting a first resistance state or a second resistance state having higher resistance than the first resistance state; and
   a write voltage generating circuit that generates a write voltage to be supplied to the resistance change memory element selected via the bit line selected, wherein
   the resistance change memory elements include a first resistance change memory element and a second resistance change memory element adjacent to the first resistance change memory element in an extending direction of the word line, and the write voltage generating circuit supplies the write voltage to the first and second resistance change memory elements connected to one selected word line and two selected bit lines adjacent to each other in a temporally overlapping manner, and generates the write voltage such that a magnitude of the write voltage supplied to the first resistance change memory element becomes smaller when a write voltage for setting of the second resistance state is supplied to the second resistance change memory element than when a write voltage for setting of the first resistance state is supplied to the second resistance change memory element.

2. The nonvolatile memory device according to claim 1, wherein
the resistance change memory elements further include a third resistance change memory element adjacent to the first resistance change memory element in the extending direction of the word line,
the first resistance change memory element is located between the second resistance change memory element and the third resistance change memory element,
each of the resistance change memory elements includes a portion formed of a chalcogenide material,
the first resistance change memory element and the second resistance change memory element are directly connected by the chalcogenide material, and the first resistance change memory element and the third resistance change memory element are not directly connected by the chalcogenide material.

3. The nonvolatile memory device according to claim 1, wherein
each of the resistance change memory elements includes a portion formed of a chalcogenide material,
every other one of inter-element regions between the resistance change memory elements arranged in the extending direction of the word line includes a chalcogenide portion formed of the chalcogenide material, and the chalcogenide portion directly connects the resistance change memory elements adjacent to each other.

4. The nonvolatile memory device according to claim 1, wherein
distances between the resistance change memory elements arranged in the extending direction of the word line are mutually different between adjacent ones of inter-element regions between the resistance change memory elements.

5. The nonvolatile memory device according to claim 1, wherein
the write voltage to the first resistance change memory element is selected in accordance with write data for the second resistance change memory element.

6. The nonvolatile memory device according to claim 1, further comprising:
a substrate;
a plurality of global bit lines provided on the substrate; and
a plurality of selection transistors, one terminal of each of which is connected to the corresponding global bit line and the other terminal of each of which is connected to the corresponding bit line,
wherein each bit line extends in a direction perpendicular to a surface of the substrate.

7. The nonvolatile memory device according to claim 1, wherein
the resistance change memory element including a material containing germanium (Ge), antimony (Sb), and tellurium (Te).

8. The nonvolatile memory device according to claim 1, further comprising:
a rectifying element connected in series to the resistance change memory element.

* * * * *